(12) United States Patent
Otremba (10) Patent No.: US 8,658,472 B2
(45) Date of Patent: Feb. 25, 2014

(54) SEMICONDUCTOR DEVICE

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/722,231

(22) Filed: Dec. 20, 2012

(65) Prior Publication Data

US 2013/0143368 A1    Jun. 6, 2013

Related U.S. Application Data

(62) Division of application No. 12/984,177, filed on Jan. 4, 2011, now Pat. No. 8,343,811, and a division of application No. 11/779,731, filed on Jul. 18, 2007, now Pat. No. 7,893,545.

(51) Int. Cl.
*H01L 21/00*    (2006.01)

(52) U.S. Cl.
USPC .... 438/124; 438/108; 438/121; 257/E21.499; 257/781

(58) Field of Classification Search
USPC .............. 257/E21.499, E21.506, E21.598, 257/E23.004, 690, 693, 778, 779, 781; 438/107–109, 113, 121, 123, 124, 126, 438/127
See application file for complete search history.

(56) References Cited

U.S. PATENT DOCUMENTS

| | | | |
|---|---|---|---|
| 4,760,948 A | 8/1988 | Spiecker | |
| 4,927,697 A * | 5/1990 | Hill | 428/198 |
| 5,001,829 A | 3/1991 | Schelhorn | |
| 5,306,948 A | 4/1994 | Yamada et al. | |
| 5,581,118 A | 12/1996 | Mays | |
| 5,684,677 A * | 11/1997 | Uchida et al. | 361/770 |
| 5,723,900 A | 3/1998 | Kojima et al. | |
| 5,723,901 A | 3/1998 | Katsumata | |
| 5,835,988 A | 11/1998 | Ishii | |
| 5,838,551 A | 11/1998 | Chan | |
| 5,936,846 A * | 8/1999 | Jairazbhoy et al. | 361/770 |
| 6,054,757 A | 4/2000 | Kobayashi | |
| 6,169,323 B1 | 1/2001 | Sakamoto | |
| 6,379,999 B1 | 4/2002 | Tanabe | |
| 6,424,031 B1 | 7/2002 | Glenn | |
| 6,495,914 B1 | 12/2002 | Sekine et al. | |
| 6,597,059 B1 | 7/2003 | McCann et al. | |
| 6,682,957 B2 | 1/2004 | Song | |
| 6,730,544 B1 | 5/2004 | Yang | |
| 6,750,545 B1 | 6/2004 | Lee et al. | |
| 6,756,666 B2 * | 6/2004 | Hosomi | 257/693 |
| 6,853,559 B2 | 2/2005 | Panella et al. | |
| 6,861,737 B1 | 3/2005 | Jeong et al. | |

(Continued)

OTHER PUBLICATIONS

Office Action mailed Jun. 16, 2010 in U.S. Appl. No. 11/779,731.

(Continued)

*Primary Examiner* — Chris Chu
(74) *Attorney, Agent, or Firm* — Dicke, Billig & Czaja, PLLC (57) ABSTRACT

A module including a carrier and a semiconductor chip applied to the carrier. An external contact element is provided having a first portion and a second portion extending perpendicular to the first portion, wherein a thickness of the second portion is smaller than a thickness of the carrier.

11 Claims, 6 Drawing Sheets

(56) References Cited

U.S. PATENT DOCUMENTS

| | | |
|---|---|---|
| 6,876,066 B2 | 4/2005 | Fee et al. |
| 6,890,066 B2 | 5/2005 | Parish et al. |
| 6,953,952 B2 | 10/2005 | Asakawa |
| 6,969,945 B2 | 11/2005 | Namba et al. |
| 7,019,397 B2 * | 3/2006 | Ohuchi et al. ............ 257/734 |
| 7,060,530 B2 | 6/2006 | Kanatake |
| 7,061,079 B2 | 6/2006 | Weng et al. |
| 7,061,091 B2 | 6/2006 | Chiu |
| 7,154,206 B2 * | 12/2006 | Shimada et al. ........ 310/313 R |
| 7,161,797 B2 | 1/2007 | Vaisman et al. |
| 7,253,532 B2 * | 8/2007 | Doescher ................ 257/790 |
| 7,425,755 B2 | 9/2008 | Liu |
| 7,629,677 B2 | 12/2009 | Youn et al. |
| 7,671,459 B2 | 3/2010 | Corisis et al. |
| 7,830,022 B2 * | 11/2010 | Theuss et al. ............ 257/779 |
| 7,968,378 B2 | 6/2011 | Mahler et al. |
| 7,968,981 B2 | 6/2011 | Yee et al. |
| 8,053,276 B2 | 11/2011 | Yu et al. |
| 2002/0100963 A1 | 8/2002 | Suzuki et al. |
| 2004/0089921 A1 | 5/2004 | Minamio et al. |
| 2005/0127494 A1 | 6/2005 | Liu |
| 2006/0118938 A1 | 6/2006 | Tandy |
| 2006/0175688 A1 | 8/2006 | Jang |
| 2007/0262435 A1 | 11/2007 | Lam |

OTHER PUBLICATIONS

Office Action mailed May 30, 2012 in U.S. Appl. No. 12/984,177.
Office Action mailed Apr. 18, 2012 in U.S. Appl. No. 12/984,214.

* cited by examiner

SEMICONDUCTOR DEVICE

CROSS-REFERENCE TO RELATED APPLICATIONS

This Utility Patent Application is a divisional application and claims the benefits of U.S. application Ser. No. 12/984,177, filed Jan. 4, 2011 and U.S. application Ser. No. 11/779,731, filed Jul. 18, 2007, the entire content of which is herein incorporated by reference.

BACKGROUND

This invention relates to a semiconductor device and a method of assembling thereof.

Power semiconductor chips may, for example, be integrated into semiconductor devices. Power semiconductor chips are suitable in particular for the switching or control of currents and/or voltages.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Modules with a semiconductor chip applied to a carrier are described below. The carrier may be of any shape, size or material. During the fabrication of the module the carrier may be provided in a way that other carriers are arranged in the vicinity and are connected by connection means or a connector to the carrier with the purpose of separating the carriers. The carrier may be fabricated from metals or metal alloys, in particular copper, copper alloys, aluminum, aluminum alloys, or other materials. It may further be electrically conductive. The carrier may be, for example, a lead-frame or a part of a lead-frame, such as a die pad. Furthermore, in some embodiments the carrier may also be manufactured of a ceramic material, such as aluminum oxide, and the carrier may be electrically insulating in this case.

The modules described below include external contact elements. The external contact elements may be accessible from outside the module and may thus allow electrical contact to be made with the semiconductor chips from outside the module. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material.

Surfaces of the carrier and/or one or more of the external contact elements may form an assembly plane. The assembly plane may serve to mount the module onto another component, such as a circuit board for example.

The semiconductor chips described below may be of extremely different types and may include for example integrated electrical or electro-optical circuits. The semiconductor chips may be, for example, configured as power transistors, power diodes, control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power transistors and power diodes may have a vertical structure. By way of example, the source terminal and gate terminal of a power transistor and the anode terminal of a power diode may be situated on one main surface, while the drain terminal of the power transistor and the cathode terminal of the power diode are arranged on the other main surface. A power diode may be embodied in particular as a Schottky diode. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The modules may include a mold material covering at least parts of the components of the modules. The mold material may be any appropriate thermoplastic or thermosetting material. Various techniques may be employed to cover the components with the mold material, for example compression molding or injection molding.

Figure 1A:
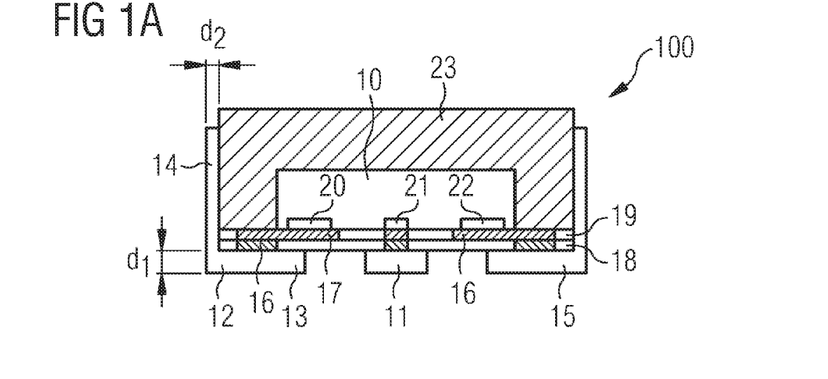
FIGS. 1A to 1C schematically illustrate a module 100 in a cross section and a plan view according to an exemplary embodiment.

FIG. 1A illustrates a module 100 in a cross section as an exemplary embodiment. The module 100 includes a semiconductor chip 10, which is mounted on a carrier 11. The module 100 further includes an external contact element 12, which has a first portion 13 and a second portion 14, wherein the second portion 14 is arranged perpendicular to the first portion 13. The carrier 11 has a thickness $d_1$, which is greater than a thickness $d_2$ of the second portion 14 of the external contact element 12.

Moreover, the module 100 may include an external contact element 15 with a first and a second portion forming a right angle similar to the external contact element 12. Electrically conductive layers 16 and 17 may be deposited on top of the carrier 11 and the external contact elements 12 and 15. The electrically conductive layers 16 and 17 may be embedded in dielectric layers 18 and 19. The semiconductor chip 10 may have contact pads 20, 21 as well as 22 and may be mounted onto the electrically conductive layer 17 with its contact pads 20, 21 and 22 facing the electrically conductive layer 17. The semiconductor chip 10 may be covered with a mold material 23.

The carrier 11 and the external contact elements 12 and 15 may be manufactured from an electrically conductive material and may be used to electrically couple the semiconductor chip 10 to components external to the module 100. For this purpose, the contact pads 20 to 22 are electrically connected to the carrier 11 and the external contact elements 12 and 15 via the electrically conductive layers 16 and 17 as illustrated in FIG. 1A.

The semiconductor chip 10 may be a power semiconductor chip, in particular a power transistor. In the latter case, the contact pads 20 and 22 may be the source and drain terminal, respectively, and the contact pad 21 may be the gate terminal.

The carrier 11 and at least the first portions of the external contact elements 12 and 15 may, for example, be part of a leadframe. The leadframe may be fabricated, for example, from copper or an iron-nickel alloy. The bottom surfaces of the carrier 11 and the external contact elements 12 and 15 may form an assembly plane for mounting the device 100 on external components.

In addition to the carrier 11, the first portion 13 of the external contact element 12 may also have a greater thickness than the second portion 14. The external contact element 15 may have the same geometry and dimensions as the external contact element 12. Furthermore, it may be provided that the carrier 11 has a greater thickness than the first portion 13 of the external contact element 13. The thickness of the carrier 11 and the first portions of the external contact elements 12 and 15 may be in the range between 100 µm and 2 mm. The thickness of the second portion of the external contact elements 12 and 15 may be in the range between 5 µm and 500 µm and in particular in the range between 10 µm and 50 µm.

The second portion 14 of the external contact element 12 may reach up to the top surface of the mold material 23, but may also be smaller. In particular, the height of the second portion 14 may be in the range between half of the height of the mold material 23 and the full height of the mold material 23. The height of the second portion 14 of the external contact element 12 may be greater than the height of the carrier 11. The height of the second portion 14 may also be greater than the height of the first portion 13 of the external contact element 12 when the height is measured in a direction perpendicular to the assembly plane.

Figure 1B:
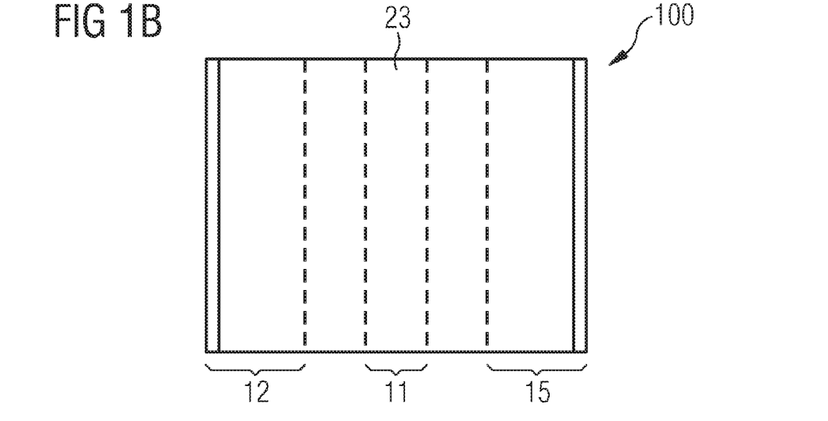
Figure 1C:
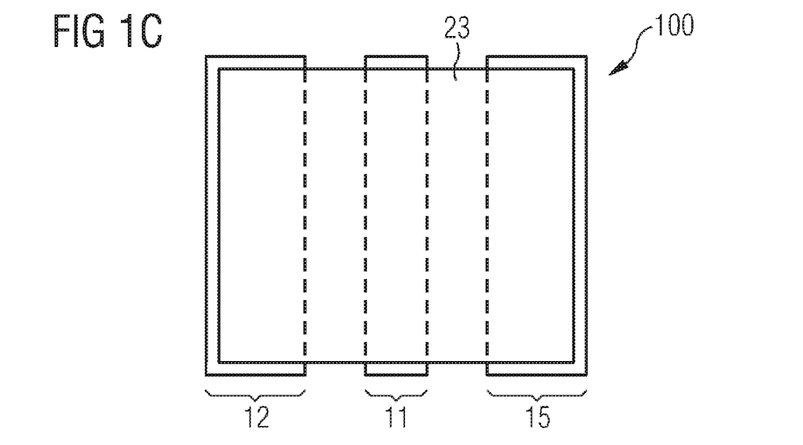

In FIGS. 1B and 1C two different implementations of the module 100 are schematically illustrated in a plan view. Here, only the top surface of the mold material 23 and the external contact elements 12 and 15 are illustrated. In the embodiment of FIG. 1B each of the second portions of the external contact elements 12 and 15 cover only the bottom surface and one side surface of the mold material 23. It may be provided that up to 30 or 40 or 50 or 60 or 70 or 80 or 90 or 100% of the respective side surface of the mold material 23 are covered by the respective external contact element 12 or 15. In the embodiment of FIG. 1C the external contact elements 12 and 15 additionally cover parts of the adjacent side surfaces of the mold material 23.

The exposed surfaces of the external contact elements 12 and 15 and the carrier 11 may be used to electrically couple the module 100 to other components. This is exemplarily illustrated in FIG. 2. There, an excerpt of a device 200 is schematically illustrated which includes the module 100 that is mounted onto a circuit board 24, for example a PCB (Printed Circuit Board). The exposed surfaces of the external contact elements 12 and 15 and the carrier 11 may have been soldered to contact areas of the circuit board 24. Thereby the exposed surfaces of the second portions of the external contact elements 12 and 15 may have also be covered with solder material 25. The second portions of the external contact elements 12 and 15 increase the contact area available for contacting with the circuit board 24. Using the side surfaces of the module 100 as additional contact surface enables higher currents to flow from and to the module 100. Furthermore, the base area of the module 100 may be decreased while keeping the maximum allowed current flowing through the drain and source terminals constant. It may, for example, be provided that each of the external contact elements 12 and 15 have an exposed surface of at least 0.5 mm² if currents are higher than 10 A.

Figure 2:
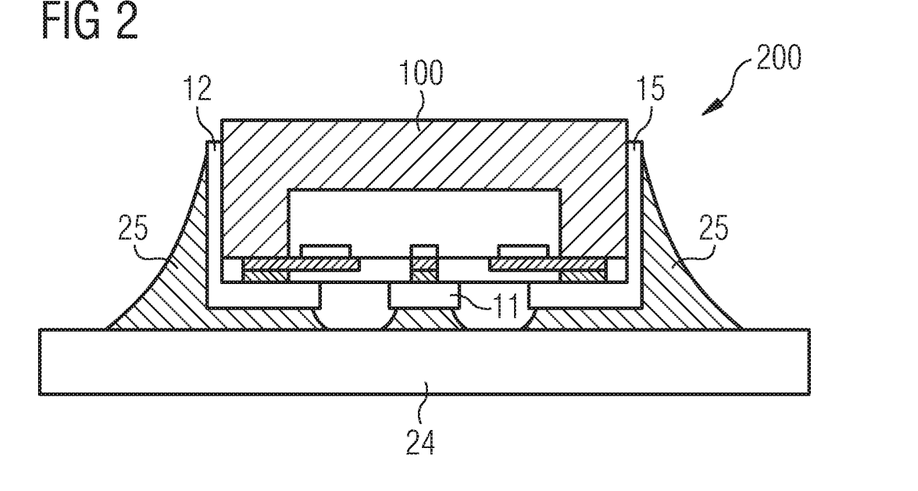
FIG. 2 schematically illustrates a device 200 in a cross section according to an exemplary embodiment.

The second portions of the external contact elements 12 and 15 covering the side surfaces of the module 100 may also be used to dissipate the heat generated by the semiconductor chip 10. For example, a heat sink or cooling element may be attached or thermally coupled to the second portions of the external contact elements 12 and 15.

Figure 3:
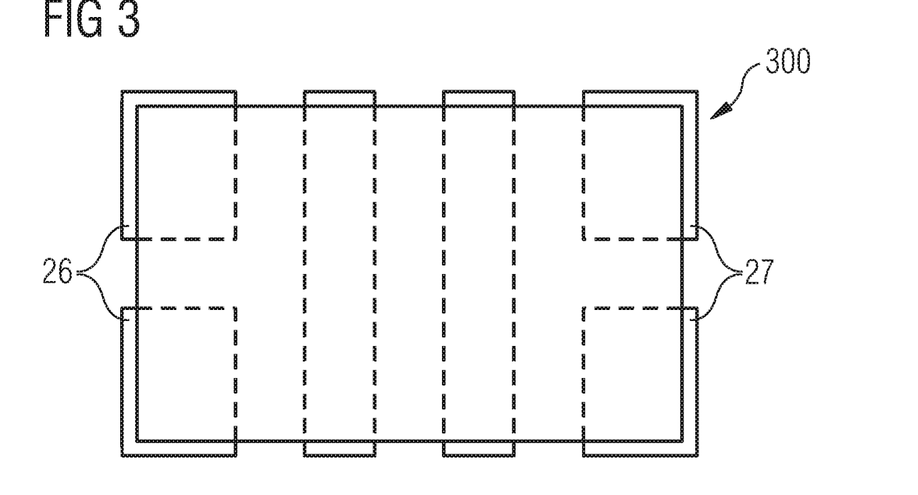
FIG. 3 schematically illustrates a module 300 in a plan view according to an exemplary embodiment.

FIG. 3 illustrates a module 300 in a plan view as a further exemplary embodiment. Similar to the external contact elements 12 and 15 of the module 100, the module 300 includes several external contact elements 26 and 27 which cover parts of the bottom surface and the side surfaces of the module 300. The module 300 may contain more than one semiconductor chips, for example two power transistors. In the latter case, the external contact elements 26 may serve as source and drain terminals of one of the power transistors and the external contact elements 27 may be the source and drain terminals of the other power transistor.

Figure 4:
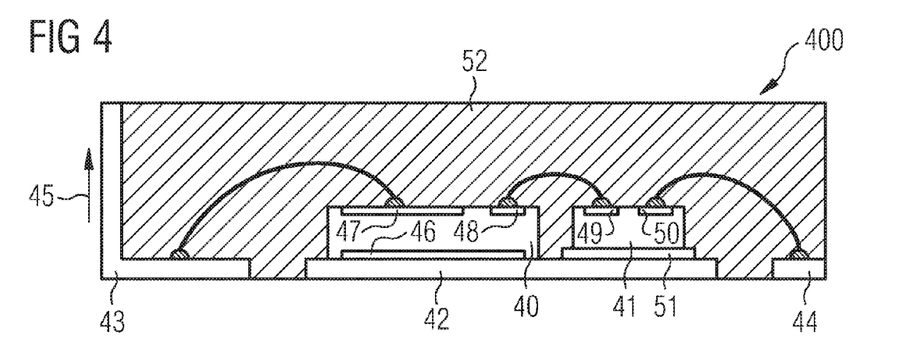
FIG. 4 schematically illustrates a module 400 in a cross section according to an exemplary embodiment.

FIG. 4 illustrates a module 400 in a cross section as a further exemplary embodiment. The module 400 includes a power semiconductor chip 40 and a control semiconductor chip 41, which are mounted on a carrier 42. The module 400 further includes a first external contact element 43 and a second external contact element 44 coupled to the power semiconductor chip 40 and the control semiconductor chip 41, respectively. The bottom surfaces of the carrier 42 and the external contact elements 43 and 44 form an assembly plane for mounting the device 400 on external components. The first and second external contact elements 43 and 44 extend in a direction 45 perpendicular to the assembly plane, wherein the extension of the first external contact element 43 in the direction 45 is greater than the extension of the second external contact element 44. A portion of the first external contact element 43 may form at least one side surface of the module 400.

The power semiconductor chip 40 may be a vertical power semiconductor, in particular a power transistor or a power diode. In case of the semiconductor chip 40 being a power transistor, its drain electrode 46 may be electrically connected to the carrier 42, which may be electrically conductive. On the main surface of the power transistor 40 facing away from the carrier 42, the source electrode 47 and the gate electrode 48 are placed. One or more bond wires or other connection elements, such as clips, may electrically connect the source electrode 47 to the first external contact element 43. The gate electrode 48 may be connected to a contact pad 49 of the control semiconductor chip 41. Another contact pad 50 of the control semiconductor chip 41 may be connected to the second external contact element 44. The function of the control semiconductor chip 41 may be to control the power semiconductor chip 40. An electrically insulating layer 51 may be arranged between the control semiconductor chip 41 and the carrier 42 thereby electrically insulating the control semiconductor chip 41 from the electrically conductive carrier 42. In one exemplary embodiment, the electrically insulating layer 51 may be glue, a foil or a piece of ceramic. The semiconductor chips 40 and 41 may be covered with a mold material 52.

The enlarged surface of the first external contact element 43 may be useful when high currents flow through the source electrode 47 of the power semiconductor chip 40. The first external contact element 43 and in particular its portion covering one or more side surfaces of the mold material 52 may also help to dissipate heat generated by the semiconductor chips 40 and 41.

Figure 5:
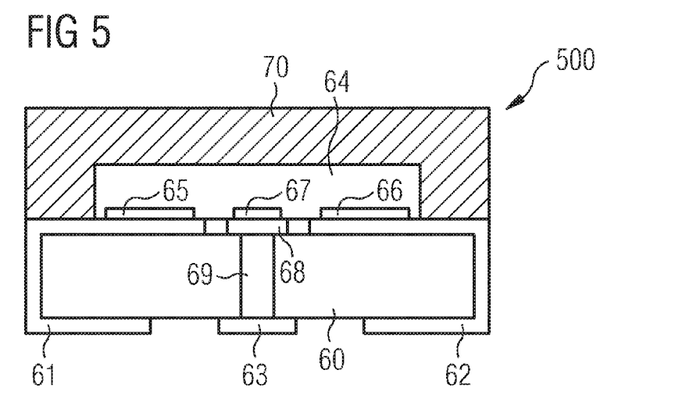
FIG. 5 schematically illustrates a module 500 in a cross section according to an exemplary embodiment.

FIG. 5 illustrates a module 500 in a cross section as a further exemplary embodiment. The module 500 includes a ceramic carrier 60, which is for example manufactured from $Al_2O_3$ or another electrically insulating ceramic material. External contact elements 61, 62 and 63 are applied to the bottom and top surfaces as well as at least some of the side surfaces of the ceramic carrier 60. The external contact elements 61 to 63 may be fabricated from a metal, such as copper, gold or aluminum, or a metal alloy or another electrically conductive material.

On top of the upper portions of the external contact elements 61 and 62 a semiconductor chip 64 is placed. The semiconductor chip 64 may be a power transistor having a drain electrode 65, a source electrode 66 and a gate electrode 67. The drain electrode 65 and the source electrode 66 may be attached to the external contact elements 61 and 62, respectively, for example by using reflow soldering, vacuum soldering, diffusion soldering or adhesive bonding by using an electrically conductive adhesive. The gate electrode 67 may be connected to the external contact element 63 via a contact element 68 arranged on the top surface of the ceramic carrier 60 and a via hole 69 filled with an electrically conductive material.

The top surface of the ceramic carrier 60 including the semiconductor chip 64 may be covered with a mold material 70 leaving the side surfaces of the ceramic carrier 60, on which the external contact elements 61 and 62 are attached, uncovered. This makes it possible to coat the side surfaces of the ceramic carrier with solder material (similar to FIG. 2) when mounting the module 500 on another component, such as a circuit board.

Figure 6:
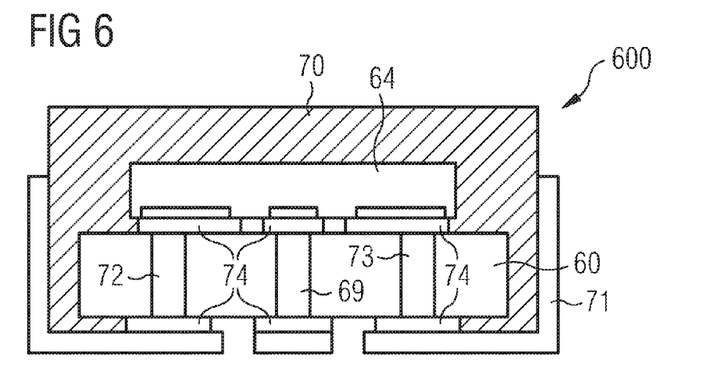
FIG. 6 schematically illustrates a module 600 in a cross section according to an exemplary embodiment.

In FIG. 6 a module 600 is schematically illustrated which is a variation of the module 500. In contrast to the module 500, the ceramic carrier 60 of the module 600 is mounted on a leadframe 71 which is similar to the leadframe 11, 12, 15 of FIG. 1A and which has portions extending into a direction perpendicular to the assembly plane. Furthermore, no external contact elements are placed on the side surfaces of the ceramic carrier 60 of the module 600. Instead, the leadframe 71 serves as external contact element. Furthermore, the ceramic carrier of the module 600 has two additional via holes 72 and 73 filled with an electrically conductive material. Each of the via holes 69, 72 and 73 is covered with a respective contact pad 74 on the top surface and the bottom surface of the ceramic carrier 60. The electrically conductive via holes 69, 72 and 73 as well as the contact pads 74 connect the source, drain and gate electrodes of the semiconductor chip 64 to the respective parts of the leadframe 71. The contact pads 74 as well as the material deposited in the via holes 69, 72 and 73 may be a metal, such as copper, gold or aluminum, or a metal alloy or another electrically conductive material.

Figure 7A:
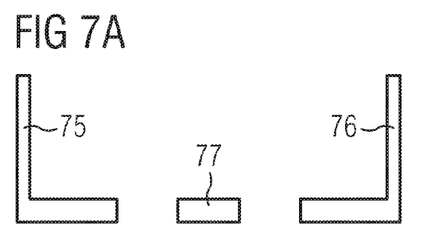
FIGS. 7A to 7E schematically illustrate an exemplary embodiment of a method to fabricate a module 700.

In FIGS. 7A to 7G different stages of the fabrication of a module 700 are exemplarily illustrated. In order to manufacture the module 700, first a leadframe is provided including external contact elements 75 and 76 as well as a carrier 77 as illustrated in FIG. 7A. Each of the external contact elements 75 and 76 has a first portion forming an assembly plane together with the carrier 76 and a second portion extending perpendicular to the assembly plane. The leadframe may be manufactured from a metal, for example copper, or an alloy, for example iron nickel. The leadframe may have been stamped or milled in order to generate the recess formed by the external contact elements 75 and 76. Alternatively, the ends of the external contact elements 75 and 76 may have been bent upwardly to obtain the shape as illustrated in FIG. 7A.

Figure 7B:
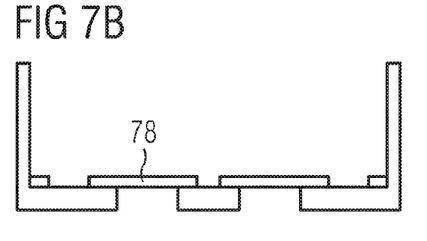

The upper surface of the carrier 77 and portions of the external contact elements 75 and 76 form a plane on which an electrically insulating foil 78 is deposited to bridge the gaps between the carrier 77 and the external contact elements 75 and 76 and to act as a platform for the deposition of further layers (see FIG. 7B). The electrically insulating foil 78 may, for example, be laminated onto the carrier 77 and the external contact elements 75 and 76 and may be structured as illustrated in FIG. 7B by a stamping process, laser ablation or any other suitable process known to a person skilled in the art. The electrically insulating foil 78 may be manufactured from a plastic or synthetic material or any other suitable material.

Figure 7C:
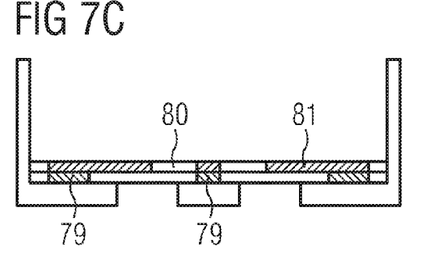

The holes generated in the electrically insulating foil 78 may be filled with a metal or a metal alloy layer 79 (see FIG. 7C). Then a dielectric layer 80, for example a silicon nitride or photoresist layer, may be deposited on the electrically insulating foil 78 and may be structured. The holes in the dielectric layer 80 may be filled with a metal or a metal alloy layer 81. The layers 79 and 81 may be generated by electroless and/or galvanic plating processes. Alternatively, other deposition methods, such as physical vapor deposition, chemical vapor deposition, sputtering, spin-on processes, spray depositing or ink jet printing may also be used. Copper, iron, nickel or other metals or metal alloys may be used as material. The thickness of the layers 79 and 81 may be in the range from 10 µm to 1 mm, in particular in the range from 50 µm to 150 µm.

Figure 7D:
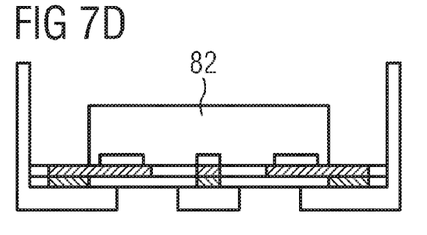

A semiconductor chip 82 is mounted onto the layer 81 with its contact pads facing the layer 81 (see FIG. 7D). In case the semiconductor chip 82 is a power transistor its contact pads are source, drain and gate electrodes and are connected to the sections of the layer 81. The electrical connection between the electrodes of the power transistors 82 and the layer 81 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the power transistor 82 and the layer 81 on account of interface diffusion processes. In this case, the use of AuSn, AgSn, CuSn, AgIn, AuIn or CuIn solders is conceivable. If the power transistor 82 is adhesively bonded to the layer 81, it is possible to use conductive adhesives which may be based on epoxy resins and be enriched with gold, silver, nickel or copper in order to produce the electrical conductivity.

Figure 7E:
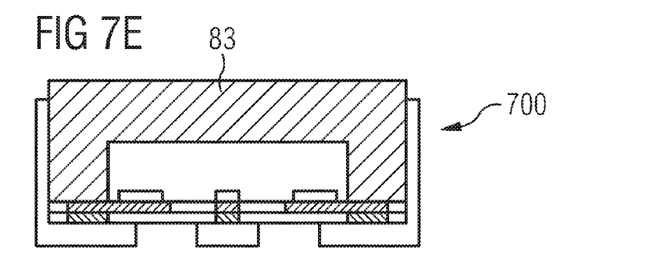

A mold material 83 is used to encapsulate the module 700 (see FIG. 7E). The mold material 83 may encapsulate any portion of the module 700, but leaves the outer surfaces of the external contact elements 75 and 76 as well as the carrier 77 uncovered. The mold material 83 may be composed of any appropriate thermoplastic or thermosetting material, in particular it may be composed of material commonly used in contemporary semiconductor packaging technology. Various techniques may be employed to cover the components of the module 700 with the mold material 83, for example compression molding or injection molding.

The module 700 is identical to the module 100 illustrated in FIG. 1 with the exception that there are no limitations regarding the thickness of the side portions of the external contact elements 75 and 76. Thus, the side portions of the external contact elements 75 and 76 may have the same thickness or may be even thicker than the carrier 77.

In FIGS. 8A to 8G different stages of the fabrication of a module 800 are exemplarily illustrated. The fabrication method illustrated in FIGS. 8A to 8G is a variation of the fabrication method illustrated in FIGS. 7A to 7E. In contrast to the method of FIGS. 7A to 7E, in the present embodiment a leadframe is provided including external contact elements 84 and 85 as well as a carrier 86 which may have essentially coplanar top and bottom surfaces (see FIG. 8A). The fabrication processes of the module 800 illustrated in FIGS. 8B to 8E may be similar or identical to the fabrication processes illustrated in FIG. 7B to 7E.

Figure 8A:
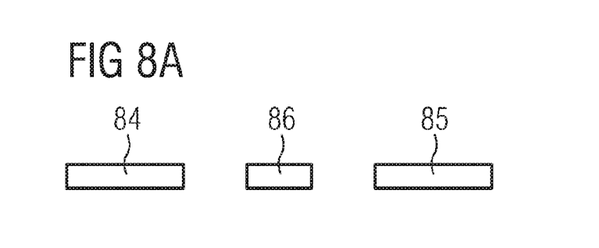
FIGS. 8A to 8G schematically illustrate an exemplary embodiment of a method to fabricate a module 800.
Figure 8B:
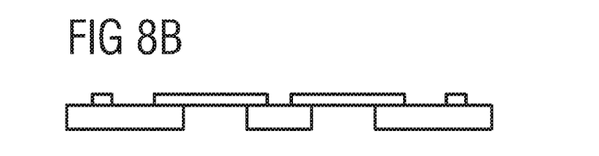
Figure 8C:
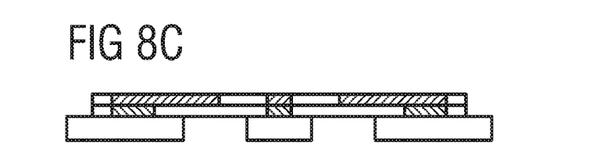
Figure 8D:
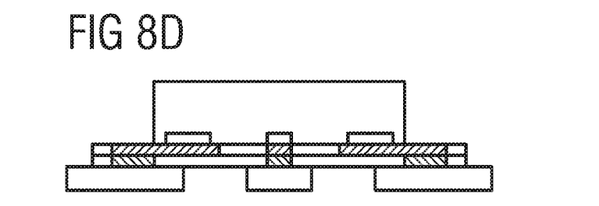
Figure 8E:
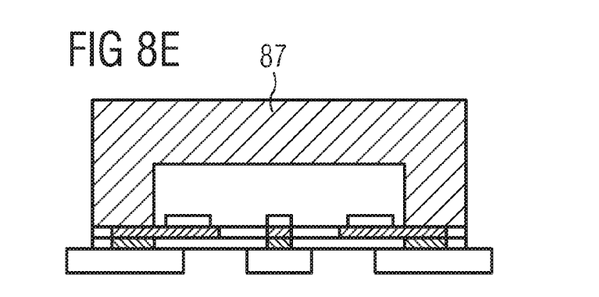
Figure 8F:
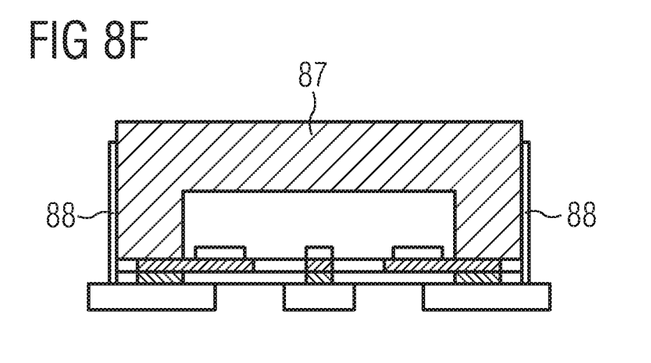

After the encapsulation of the module 800 with a mold material 87, some of the side surfaces of the mold material 87 may be covered with an electrically conductive seed layer 88 (see FIG. 8F). An electroless deposition method may be used to produce the seed layer 88. The seed layer 88 may have a thickness of up to 1 µm and may for example be made of zinc.

Figure 8G:
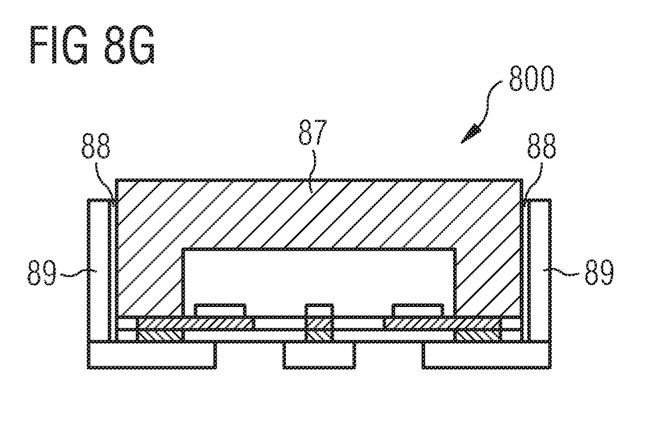

The electrical conductivity of the seed layer 88 may be used to galvanically deposit an electrically conductive layer 89 on the seed layer 88. The electrically conductive layer 89 may, for example, consist of copper and may have a thickness of up to 100 um and in particular in the range between 1 µm and 10 µm. During the galvanic deposition of the electrically conductive layer 89, the external contact elements 84 and 85 may serve as electrodes.

The seed layer 88 and the electrically conductive layer 89 are electrically connected to the respective external contact elements 84 and 85 so that they can serve as the side portions of the external contact elements 84 and 85 similar to the external contact elements 12 and 15 of the device 100 illustrated in FIG. 1A. As an alternative to the electroless and galvanic deposition of the layers 88 and 89, other deposition methods, such as physical vapor deposition, chemical vapor deposition, sputtering, spin-on processes, spray depositing or ink jet printing, may be employed to deposit an electrically conductive layer on at least one side surface of the mold material 87.

In addition, while a particular feature or aspect of an embodiment of the invention may have been disclosed with respect to only one of several implementations, such feature or embodiment may be combined with one or more other features or embodiments of the other implementations as may be desired and for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a semiconductor device, comprising:
    providing a carrier and an external contact element;
    placing a semiconductor chip on the carrier;
    depositing a mold material on the semiconductor chip; and
    depositing an electrically conductive material on a side surface of the mold material, wherein the electrically conductive material is electrically coupled to the external contact element.

2. The method of claim 1, further comprising depositing the electrically conductive material on a side surface of the mold material galvanically.

3. The method of claim 1, wherein the electrically conductive material is coupled to the external contact element by welding or soldering.

4. The method of claim 1, further comprising providing the carrier and the external contact element with coplanar top and bottom surfaces.

5. The method of claim 1, further comprising depositing an electrically insulating layer on the carrier and the external contact element to bridge a gap between the carrier and the external contact element.

6. The method of claim 1, further comprising depositing the electrically conductive material on the side surface of the mold material to a thickness smaller than a thickness of the carrier.

7. The method of claim 1, further comprising defining an assembly plane with the carrier and the external contact element.

8. The method of claim 1, further comprising covering the electrically conductive material deposited on the side surface of the mold material with a solder material.

9. The method of claim 1, further comprising depositing the electrically conductive material on the side surface of the mold material to a thickness smaller than a thickness of the external contact element.

10. The method of claim 1, further comprising depositing the electrically conductive material on the side surface of the mold material to a height greater than a height of the carrier.

11. The method of claim 1, further comprising depositing the electrically conductive material on the side surface of the mold material to a height greater than the height of the external contact element.

* * * * *